United States Patent
Nakamura et al.

(10) Patent No.: US 9,568,776 B2
(45) Date of Patent: Feb. 14, 2017

(54) SEALED BODY AND METHOD FOR MANUFACTURING THE SAME

(71) Applicant: Semiconductor Energy Laboratory Co., Ltd., Kanagawa-ken (JP)

(72) Inventors: Daiki Nakamura, Kanagawa (JP); Yusuke Kubota, Kanagawa (JP); Yusuke Nishido, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 14/068,694

(22) Filed: Oct. 31, 2013

(65) Prior Publication Data

US 2014/0125935 A1   May 8, 2014

(30) Foreign Application Priority Data

Nov. 2, 2012 (JP) ................. 2012-242828

(51) Int. Cl.
*G02F 1/1339* (2006.01)
*H01L 51/52* (2006.01)
*H01L 27/32* (2006.01)
*G02F 1/1345* (2006.01)
*G02F 1/1333* (2006.01)

(52) U.S. Cl.
CPC ......... *G02F 1/1339* (2013.01); *H01L 51/5246* (2013.01); *G02F 1/13338* (2013.01); *G02F 1/13452* (2013.01); *H01L 27/3276* (2013.01)

(58) Field of Classification Search
CPC  G02F 1/1339; G02F 1/13452; G02F 1/13338; H01L 51/5246; H01L 27/3276
See application file for complete search history.

(56) References Cited

U.S. PATENT DOCUMENTS

| | | | | |
|---|---|---|---|---|
| 5,889,569 | A * | 3/1999 | Okamoto et al. | 349/110 |
| 6,424,394 | B1 * | 7/2002 | Morii | 349/110 |
| 6,466,294 | B1 * | 10/2002 | Yamagishi | G02F 1/1339 29/830 |
| 6,555,025 | B1 | 4/2003 | Krupetsky et al. | |
| 7,372,535 | B2 * | 5/2008 | Tashiro et al. | 349/187 |
| 8,448,468 | B2 | 5/2013 | Pastel et al. | |
| 8,926,389 | B2 | 1/2015 | Nishido | |
| 9,048,350 | B2 | 6/2015 | Nishido | |
| 9,105,869 | B2 | 8/2015 | Nishido | |
| 2002/0011975 | A1 * | 1/2002 | Yamazaki et al. | 345/76 |
| 2004/0045663 | A1 | 3/2004 | Katayama et al. | |
| 2004/0223108 | A1 * | 11/2004 | Hsieh et al. | 349/153 |

(Continued)

FOREIGN PATENT DOCUMENTS

JP  2011-524073  8/2011
JP  2011-529624  12/2011

*Primary Examiner* — Dennis Y Kim
(74) *Attorney, Agent, or Firm* — Husch Blackwell LLP (57) ABSTRACT

A sealed body which is sealed with low-melting-point glass and has high airtightness is provided. In the sealed body, at least a wiring layer is provided between two facing substrates, the two substrates are bonded together with the use of a sealing layer containing glass frits as a material, and a metal layer is selectively provided in a region where the wiring layer and the sealing layer overlap. In a laser light irradiation step, the metal layer functions as a laser light reflecting film and suppresses application of excess energy to a sealing member in a region overlapping with the wiring layer.

20 Claims, 5 Drawing Sheets

(56) References Cited

U.S. PATENT DOCUMENTS

| | | | |
|---|---|---|---|
| 2006/0139553 A1* | 6/2006 | Kang | G02F 1/13394 349/149 |
| 2006/0139556 A1* | 6/2006 | Ahn | G02F 1/13394 349/153 |
| 2006/0232740 A1* | 10/2006 | Shigemura | G02F 1/1339 349/153 |
| 2007/0154629 A1* | 7/2007 | Fujita | C01G 19/00 427/126.3 |
| 2008/0129945 A1* | 6/2008 | Kim | G02F 1/1341 349/153 |
| 2009/0303427 A1* | 12/2009 | Kondo et al. | 349/153 |
| 2010/0304513 A1 | 12/2010 | Nguyen et al. | |
| 2011/0014427 A1 | 1/2011 | Burgess et al. | |
| 2011/0135857 A1 | 6/2011 | Logunov et al. | |
| 2011/0209813 A1 | 9/2011 | Shibuya et al. | |
| 2011/0223360 A1* | 9/2011 | Shibuya | C03C 8/04 428/34 |
| 2011/0242472 A1* | 10/2011 | Sawado | 349/139 |
| 2012/0050241 A1* | 3/2012 | Huang | G02F 1/1339 345/206 |
| 2013/0134397 A1 | 5/2013 | Yamazaki et al. | |
| 2013/0134398 A1 | 5/2013 | Yamazaki et al. | |
| 2013/0164486 A1* | 6/2013 | Yamada et al. | 428/76 |
| 2013/0239622 A1 | 9/2013 | Haase Pastel et al. | |
| 2014/0027743 A1 | 1/2014 | Nishido | |
| 2014/0116614 A1 | 5/2014 | Fukai et al. | |
| 2015/0340649 A1 | 11/2015 | Nishido | |

\* cited by examiner

SEALED BODY AND METHOD FOR MANUFACTURING THE SAME

BACKGROUND OF THE INVENTION

1. Field of the Invention

The invention disclosed in this specification and the like relates to a sealed body and a method for manufacturing the sealed body. In particular, the invention relates to a sealed body (a semiconductor device) internally including a semiconductor element.

In this specification and the like, a semiconductor device refers to all types of devices which can function by utilizing semiconductor characteristics; an electro-optical device, an image display device, a semiconductor circuit, and an electronic appliance are all semiconductor devices.

2. Description of the Related Art

As a method of enclosing an element between a pair of facing substrates, a technique in which substrates are bonded to each other using powdered low-melting-point glass (also referred to as glass frits) as a sealing material to form a sealed body with a high sealed property is known.

Such glass frits have a high barrier property; thus, a sealed space can be kept away from the external atmosphere. The method of sealing with glass fits has been applied to, for example, a device including a semiconductor element such as an organic electroluminescence (EL) element, an organic semiconductor element, an organic solar cell, or a liquid crystal element.

In the method of sealing with glass frits, in general, the following steps are performed: a sealing member containing glass frits made of low-melting-point glass and a binder is applied along a rim of a glass substrate; the sealing member is baked to reduce or remove the binder; the glass substrate is overlapped with a counter substrate; the sealing member is irradiated with laser light to melt the glass fits contained in the sealing member, so that a sealing layer is formed; and the glass substrate and the counter substrate are welded, so that a sealed body with high airtightness is formed, In laser light irradiation, the laser light is absorbed in or reflected by a wiring layer in a region where a sealing member and the wiring layer (electrode) overlap; thus, the energy of laser light which is needed for welding is different from the energy of laser light which is needed for another region (i.e., a region where the sealing member and the wiring layer do not overlap). When the sealing member in the overlap region is irradiated with excess energy due to reflection of the laser light by the wiring layer, the adhesion between the sealing member in the region and the substrate is reduced. Furthermore, in some cases, the wiring layer is deformed or disconnected due to absorption of the laser light in the wiring layer.

Patent Document 1 discloses a sealing method in which a reflective mask is provided in a region which is over a counter substrate and overlaps with an electrode so that the region is irradiated with lower energy of laser light.

REFERENCE

[Patent Document 1] Japanese Published Patent Application No. 2011-529624

SUMMARY OF THE INVENTION

However, in the case where a reflective mask is provided outside a counter substrate as in the sealing method disclosed in Patent Document 1, when the reflective mask formed of a metal film is directly irradiated with laser light, a surface of a semiconductor device and/or a laser optical system might be contaminated because of peeling of the metal film. Furthermore, deterioration of the reflective mask due to deformation of the metal film might cause a reduction in yield.

In view of the above, objects of embodiments of the present invention are to provide a sealed body which is sealed with low-melting-point glass and has high airtightness and to provide a method for manufacturing the sealed body.

Another object of one embodiment of the present invention is to provide a method for providing a sealed body sealed with low-melting-point glass, with high yield.

Note that one embodiment of the present invention achieves at least one of the above objects.

One embodiment of the disclosed invention is a sealed body in which at least a wiring layer is provided between two facing substrates and the two substrates are bonded together with the use of a sealing layer containing glass fits as a material, and a metal layer is selectively provided in a region where the wiring layer and the sealing layer overlap. In a laser light irradiation step, the metal layer functions as a laser light semi-transmissive film and suppresses application of excess energy to a sealing member in a region overlapping with the wiring layer.

This structure makes it possible to accurately and uniformly melt glass frits contained in a sealing member in the form of a closed loop to form a sealing layer without complicate adjustment of laser light irradiation even in the case where the sealing member is irradiated with laser light with a given amount of energy. Moreover, the metal layer is provided between the two facing substrates; thus, peeling or deformation of the metal layer due to the laser light irradiation can be prevented. Specifically, for example, the structure described below can be employed.

One embodiment of the present invention is a sealed body including a first substrate provided with a wiring layer, a second substrate which faces the first substrate and whose surface facing the first substrate is provided with a metal layer, and a sealing layer which is in the form of a closed loop so as to overlap with part of the wiring layer and bonds the first substrate and the second substrate together with a given space therebetween. The wiring layer extends outward from the inside of the closed-loop sealing layer. The metal layer is selectively provided in a region where the wiring layer and the sealing layer overlap.

One embodiment of the present invention is a sealed body including a first substrate provided with a wiring layer, a second substrate which faces the first substrate and whose surface facing the first substrate is provided with a metal layer, and a sealing layer which is in the form of a closed loop so as to overlap with part of the wiring layer and bonds the first substrate and the second substrate together with a given space therebetween. The wiring layer extends outward from the inside of the closed-loop sealing layer. The metal layer is selectively provided in a region where the wiring layer and the sealing layer overlap and has lower light transmittance than the second substrate.

In the above sealed body, a semiconductor element is enclosed within the closed-loop sealing layer (within a frame), so that a semiconductor device can be obtained. As the semiconductor element, a liquid crystal element or a light-emitting element may be included. In other words, a sealed body which includes a liquid crystal element within the closed-loop sealing layer of the above sealed body (i.e., a liquid crystal display device) and a sealed body which includes a light-emitting element within the closed-loop sealing layer of the above sealed body (i.e., a light-emitting display device) are also embodiments of the present invention.

Another embodiment of the present invention is a method for manufacturing a sealed body including the steps of: forming a metal layer over a first substrate; placing a sealing member containing low-melting-point glass and a binder in the form of a closed loop over and in contact with the metal layer and the first substrate; performing first heat treatment on the sealing member to reduce the binder; preparing a second substrate provided with a wiring layer; overlapping the first substrate and the second substrate so that the wiring layer and the metal layer overlap; and performing second heat treatment on the sealing member to melt the low-melting-point glass and weld the first substrate and the second substrate.

In the above method for manufacturing a sealed body, laser light irradiation treatment is preferably performed as the second heat treatment.

According to one embodiment of the present invention, the airtightness of a sealed body in which sealing is performed with the use of glass frits as a material can be improved.

According to one embodiment of the present invention, a sealed body in which sealing is performed with the use of glass frits as a material can be provided with high yield.

BRIEF DESCRIPTION OF THE DRAWINGS

FIGS. 2A to 2C, 2D1, 2D2, and 2E illustrate an example of a method for manufacturing a sealed body.

DETAILED DESCRIPTION OF THE INVENTION

Hereinafter, embodiments of the present invention will be described in detail with reference to the accompanying drawings. Note that the present invention is not limited to the description below and it is easily understood by those skilled in the art that the mode and details can be changed in various ways. Therefore, the invention should not be construed as being limited to the description in the following embodiments.

Note that in each drawing described in this specification and the like, the size, the film thickness, or the region of each component is exaggerated for clarity in some cases. Therefore, embodiments of the present invention are not limited to such scales.

Note that the ordinal numbers such as "first" and "second" in this specification and the like are used for convenience and do not denote the order of steps or the stacking order of layers. In addition, the ordinal numbers in this specification do not denote particular names which specify the present invention.

Embodiment 1

In this embodiment, one embodiment of a sealed body and one embodiment of a method for manufacturing the sealed body are described with reference to FIGS. 1A to 1D and FIGS. 2A to 2E.

Figure 1A:
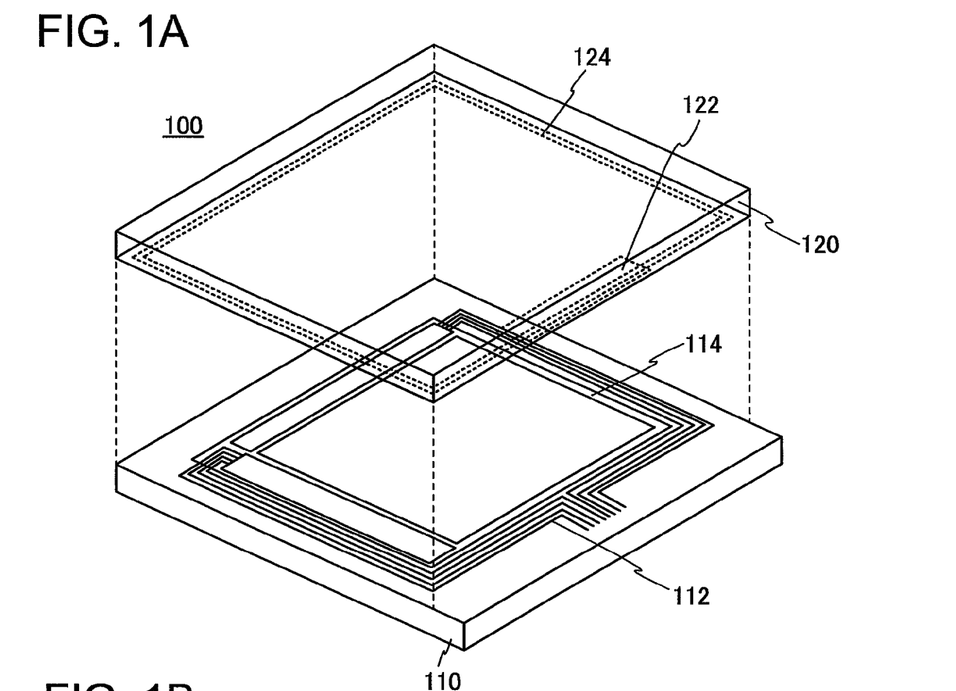
FIGS. 1A to 1D are plan views and cross-sectional views illustrating an example of a sealed body.
Figure 1B:
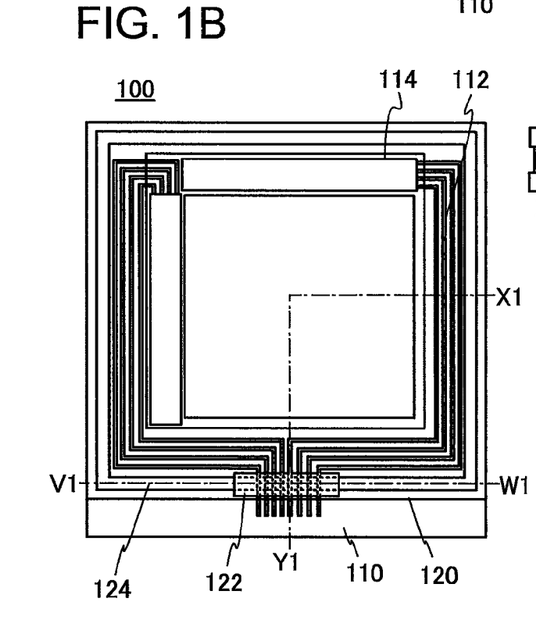
Figure 1C:
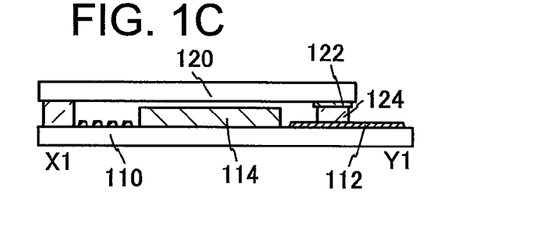
Figure 1D:
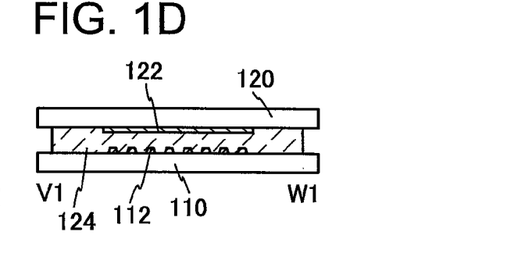

FIGS. 1A to 1D illustrate a structure example of a sealed body. FIG. 1A is an exploded perspective view of a sealed body 100. FIG. 1B is a plan view of the sealed body 100. FIG. 1C is a cross-sectional view taken along line X1-Y1 in FIG. 1B. FIG. 1D is a cross-sectional view taken along line V1-W1 in FIG. 1B.

In the sealed body of one embodiment of the present invention, a first substrate provided with at least a wiring layer and a second substrate provided with at least a metal layer are firmly attached to each other with a sealing layer. In this embodiment, a case where a semiconductor device including a semiconductor element inside a sealed body is manufactured is described as an example.

In the sealed body 100 illustrated in FIGS. 1A to 1D, an element formation substrate 110 and a counter substrate 120 are firmly attached to each other with a sealing layer 124. The sealing layer 124 is formed in the form of a closed loop. A semiconductor element 114 is enclosed within the closed-loop frame. A wiring layer 112 electrically connected to the semiconductor element 114 extends outward from the inside of the closed-loop sealing layer 124. Thus, the sealing layer 124 overlaps with part of the wiring layer 112 (see FIGS. 1A and 1B).

The sealing layer 124 in the sealed body 100 of one embodiment of the present invention contains glass frits as a material. The sealing layer 124 is formed in such a manner that glass frits contained in a layer (also referred to as a sealing member) serving as a precursor of the sealing layer 124 is heated by irradiation with laser light or the like to be melted.

The wiring layer 112 is provided in order to electrically connect the semiconductor element 114 provided over the element formation substrate 110 to an external power source (not illustrated). As described above, the wiring layer 112 extends outward from the inside of the closed-loop sealing layer 124, and the extending wiring layer 112 protrudes from the counter substrate 120. A region where the wiring layer 112 protrudes from the counter substrate 120 functions as a connection terminal.

A metal layer 122 is provided on the counter substrate 120 on the side where the wiring layer 112 and the sealing layer 124 overlap. The metal layer 122 has higher reflectance with respect to laser light emitted in a manufacturing process of the sealing layer 124 than the counter substrate 120.

In a manufacturing process of the sealed body 100, when the layer (sealing member) serving as the precursor of the sealing layer 124 is irradiated with laser light to melt the glass frits, the metal layer 122 reflects part of the laser light emitted from the counter substrate 120 side and functions as a semi-transmissive film for reducing the energy of laser light passing through the metal layer 122 to a region overlapping with the metal layer 122 (i.e., a region where the wiring layer 112 and the sealing layer 124 overlap). In a region where the wiring layer 112 and the sealing member overlap, laser light reflected by the wiring layer 112 enters the sealing member; the metal layer 122 provided can suppress irradiation of the sealing member in the region with excess energy.

For example, the energy of laser light passing through the counter substrate 120 to enter the sealing member is made to be substantially equal to the total of the energy of laser light passing through the counter substrate 120 and the metal layer 122 to enter the sealing member and the energy of laser light reflected by the wiring layer 112 to enter the sealing member, whereby irradiation of the sealing member with excess energy due to reflection by the wiring layer 112 can be suppressed while the energy of the laser light with which the substrate surface is irradiated (the energy of the laser light emitted from a laser irradiation apparatus) is being kept uniform. Thus, the adhesion of the sealing member can be improved. Further, the sealed body 100 with high airtightness can be provided.

Note that an example in which the sealing layer 124 is quadrangular is described in this embodiment. However, the shape of the sealing layer 124 is not limited to the shape described in this embodiment as long as it is in the form of a closed loop. In addition, the shape of the wiring layer 112 is not limited to the shape illustrated in FIGS. 1A to 1D.

FIGS. 1A to 1D illustrate, as an example, a case where the counter substrate 120 is provided with only the metal layer 122; however, this embodiment is not limited thereto. For example, the counter substrate 120 may be provided with a color filter layer, a polarizing plate, or the like.

A method for manufacturing a sealed body 100 in FIGS. 1A to 1D is described with reference to FIGS. 2A to 2C, 2D1 and 2D2, and 2E.

Figure 2A:
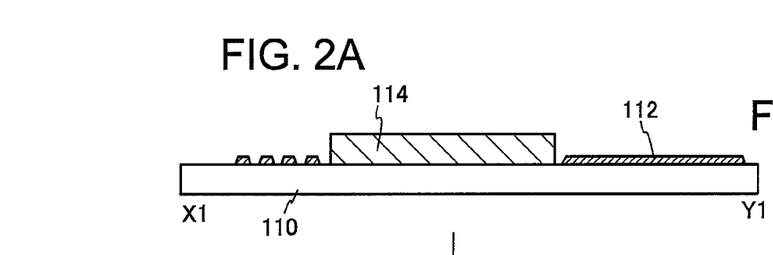

The semiconductor element 114 and the wiring layer 112 which electrically connects the semiconductor element 114 to an external power source are formed over the element formation substrate 110 (see FIG. 2A). Note that an insulating layer may be formed over the wiring layer 112.

A material which has heat resistance high enough to withstand a manufacturing process of a semiconductor device is used for the element formation substrate 110. The element formation substrate 110 is not particularly limited in size and thickness as long as it can be used in a manufacturing apparatus. Further, the element formation substrate 110 may have flexibility with which the semiconductor element 114 is not broken. As the substrate having flexibility, for example, glass as thin as 50 µm to 500 µm or a metal foil can be used.

The element formation substrate 110 may be a substrate using an inorganic material or a substrate using a composite material of an organic material and an inorganic material. Examples of the substrate using an inorganic material include a glass substrate, a ceramic substrate, and a metal substrate. Examples of the substrate using a composite material of an organic material and an inorganic material include a lamination of a resin substrate and an inorganic material, fiberglass-reinforced plastics (FRP), and a prepreg.

Figures 2B, 2C:
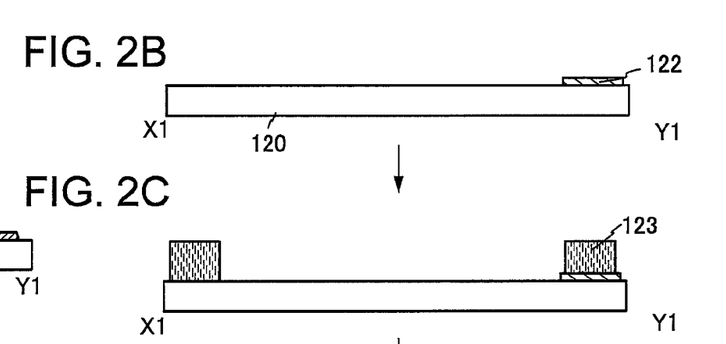

The metal layer 122 is selectively formed over the counter substrate 120 which is to face the element formation substrate 110 (see FIG. 2B).

As the counter substrate 120, a substrate using a composite material of an organic material and an inorganic material may be used as well as a substrate using an inorganic material, as in the case of the element formation substrate 110. Note that a light-transmitting material through which laser light is transmitted is used for the counter substrate 120 at least in a region where the sealing layer 124 is formed.

The metal layer 122 is positioned so as to overlap with part of the wiring layer 112 of the element formation substrate 110 in a later step. The metal layer 122 functions as a semi-transmissive film for reducing transmission of laser light so that the sealing member in a region overlapping with the wiring layer 112 is not irradiated with excess energy. For this reason, a material having lower laser light transmittance (higher laser light reflectance) than at least the counter substrate 120 is selected.

As the metal layer 122, for example, a layer which contains a metal element such as silver, gold, platinum, nickel, tungsten, chromium, molybdenum, iron, cobalt, copper, palladium, aluminum, manganese, titanium, or tantalum, a layer which contains an alloy containing one or more of these metal elements, or the like can be used. Note that the metal layer 122 can be any layer which contains a metal element and has lower laser light transmittance than the counter substrate 120; an oxide film, a nitride film, or an oxynitride film of any of the above metal elements can be used.

Note that the kind of material suitable for the metal layer 122 depends on the wavelength of emitted laser light. The metal layer 122 is not limited to a single layer and may include a plurality of layers. The light transmittance of the metal layer 122 may be set by adjustment of the thickness of the metal layer 122. Further, the shape and formation portion of the metal layer 122 are not limited to those illustrated in FIG. 2B. For example, an opening portion may be formed in the metal layer 122 with a rectangular shape to adjust the energy of laser light with which the sealing member in the region overlapping with the metal layer 122 is irradiated. Alternatively, a plurality of metal layers 122 may be formed over the counter substrate 120.

The metal layer 122 can be formed by any of a variety of methods. The metal layer 122 can be formed by, for example, a sputtering method, an electron beam evaporation method, or a vacuum evaporation method.

It is preferable that the metal layer 122 be formed at the same time as a step of forming an alignment marker (not illustrated), which is for aligning the substrate to be attached to the counter substrate 120, at an end portion of the counter substrate 120. In this case, a step of forming an alignment marker can be omitted and an increase in the number of masks can be prevented. Thus, manufacturing costs of a semiconductor device can be reduced.

Next, a sealing member 123 is applied in the form of a closed loop onto the metal layer 122 and the counter substrate 120.

The sealing member 123 is a mixture of glass frits made of powdered glass of low-melting-point glass and a binder formed of, for example, an organic resin diluted with an organic solvent. The sealing member 123 can be selectively applied by a known method, for example, a coating method such as a dispensing method or an ink-jet method and a printing method such as a screen printing method. In particular, when a large substrate is used, a coating method such as a dispensing method is preferably employed.

The glass material used for the glass frits preferably contains one or more compounds selected from, for example, the following group: magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass. In addition, in the case where laser light irradiation is used in heat treatment performed later, glass frits to which a laser light absorbent material is added is preferably used. The laser light absorbent material is selected as appropriate depending on the wavelength of the laser light used.

The height (thickness) of the sealing member 123 is adjusted so that the thickness after removal of the binder in a later heating step is larger than those of at least the semiconductor element 114 and the wiring layer 112 provided over the element formation substrate 110. Further, for example, after the sealing member 123 is applied by a dispensing method or the like, a flat plate or the like may be pressed against the sealing member 123 or a top surface of the sealing member 123 may be flattened with the use of a spatula or the like so that the sealing member 123 has a uniform height and improved flatness.

In FIG. 2C, the width of the sealing member 123 is narrower than that of the metal layer 122. However, one embodiment of the present invention is not limited thereto, and the width of the sealing member 123 may be substantially equal to that of, for example, the metal layer 122. Alternatively, the thickness of the sealing member 123 can be set to be smaller than and the width of the sealing member 123 can be set to be larger than those of the semiconductor element 144 and the wiring layer 112 in advance in view of an increase in the thickness of the central portion of the sealing member 123 by surface tension at the time when the glass frits are melted and clump.

Next, the sealing member 123 is heated (prebaked) to volatilize the binder contained in the sealing member 123. The heat treatment is performed using a lamp, a heater, or the like. The heating temperature is preferably close to the glass transition point of the glass frits which are used. The heating temperature may be, for example, approximately 300° C. to 450° C.

The glass frits contained in the sealing member 123 may be completely melted and firmly attached one another to be one or may be partly welded by the prebaking. In addition, the binder might fail to be completely removed and remain in the sealing member 123 depending on the conditions of the prebaking. An absorbent material which absorbs laser light with which irradiation is performed later may be dispersed in the sealing member 123 after the prebaking.

Figure 2D:
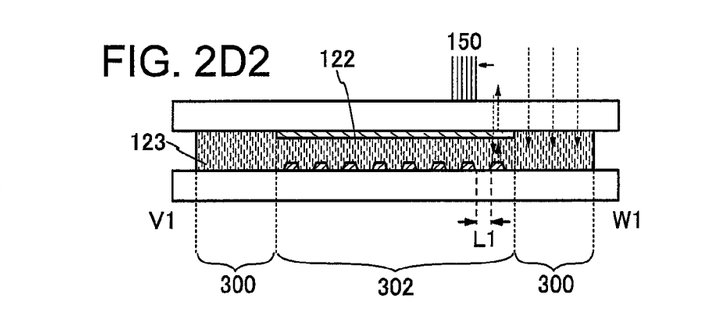
Figure 2D:
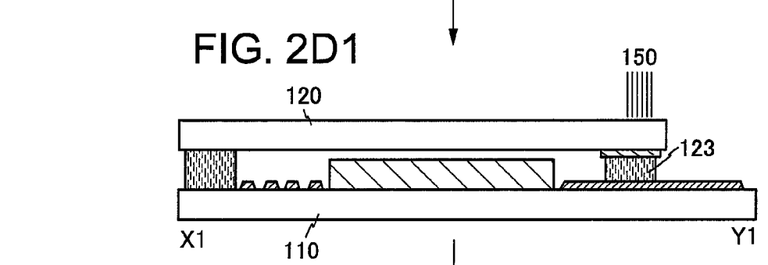
Figure 2E:
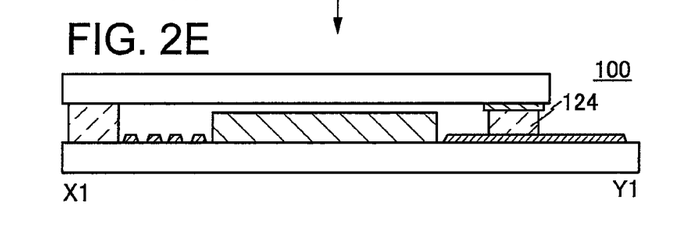

Next, the element formation substrate 110 and the counter substrate 120 are positioned so that a surface provided with the sealing member 123 faces a surface provided with the wiring layer 112. Here, the two substrates are aligned so that the metal layer 122 on the counter substrate 120 overlaps with the wiring layer 112. After that, the sealing member 123 is locally heated by being irradiated with laser light 150 (see FIG. 2D1).

The irradiation with the laser light 150 is preferably performed while a region where the sealing member 123 is provided is being scanned with the laser light 150.

The laser light 150 is emitted through the counter substrate 120; thus, light with a wavelength which can be transmitted through at least the counter substrate 120 is used; it is more preferable to use light with a wavelength in the visible light region or the infrared region.

Examples of a laser which emits light with a wavelength in the visible light region or the infrared region include gas lasers such as an Ar laser, a Kr laser, and a $CO_2$ laser. Examples of a solid-state laser include a YAG laser, a $YVO_4$ laser, a YLF laser, a $YAlO_3$ laser, a $GdVO_4$ laser, a KGW laser, a KYW laser, an alexandrite laser, a Ti:sapphire laser, and a $Y_2O_3$ laser. Note that in the solid-state laser, the fundamental wave or the second harmonic is preferably used. A semiconductor laser such as a GaN laser, a GaAs laser, a GaAlAs laser, or an InGaAsP laser can be used. The semiconductor laser has advantages of stable oscillation output, low maintenance frequency, and low operational costs.

Further, with the use of light having high energy which does not transmit through the counter substrate 120 (e.g., wavelength in the ultraviolet region), the sealing member 123 can be directly irradiated with the laser light 150 to be heated.

Examples of the laser which emits light with a wavelength in the ultraviolet region include excimer lasers such as a XeCl laser and a KrF laser. In addition, there are solid-states lasers such as a YAG laser, a $YVO_4$ laser, a YLF laser, a $YAlO_3$ laser, a $GdVO_4$ laser, a KGW laser, a KYW laser, an alexandrite laser, a Ti:sapphire laser, and a $Y_2O_3$ laser. Note that in the solid-state laser, the third harmonic or the fourth harmonic is preferably used.

It is preferable that the sealing member 123 be irradiated with the laser light 150 to be heated while being applied with pressure so that the sealing member 123 is in contact with the element formation substrate 110 without fail. The pressure may be applied to the sealing member 123 with the element formation substrate 110 and the counter substrate 120 held with a clamp outside the region irradiated with the laser light 150, or the pressure may be applied to one or both of the surfaces of the element formation substrate 110 and the counter substrate 120.

Further, the inside of the sealed region is preferably brought into an inert gas atmosphere or a reduced pressure atmosphere after the irradiation with the laser light 150. For example, before irradiation with the laser light 150, an organic resin such as an ultraviolet curable resin or a thermosetting resin is placed outside or inside a region where the sealing member 123 is applied, the element formation substrate 110 and the counter substrate 120 are temporarily bonded to each other in an inert gas atmosphere or a reduced gas atmosphere, and then irradiation with the laser light 150 may be performed. Owing to the closed-loop form of the sealing member 123, the inside of the sealed region can be kept in the inert gas atmosphere or the reduce pressure atmosphere, and irradiation with the laser light 150 can be performed under atmospheric pressure; thus, an apparatus can have a simple structure. Further, the inside of the sealed region is brought into a reduced pressure atmosphere in advance, whereby the sealing member 123 and the element formation substrate 110 can be in contact with each other without fail even without using a mechanism such as a clamp for pressing the two substrates at the time of irradiation with the laser light 150.

FIG. 2D2 is a schematic view of a step of irradiation with the laser light 150 in a cross section V1-W1 in FIG. 1B.

The laser light 150 is emitted to the sealing member 123 through the counter substrate 120. Here, the metal layer 122 has lower laser light 150 transmittance (higher laser light 150 reflectance) than the counter substrate 120; thus, the energy of the laser light 150 entering a region 302 overlapping with the metal layer 122 is lower than that of the laser light 150 entering a region 300 which does not overlap with the metal layer 122. The metal layer 122 is provided in a region overlapping with the wiring layer 112. The laser light 150 entering the sealing member 123 with the energy reduced by the metal layer 122 is reflected by the wiring layer 112, and then enters the sealing member 123 again. Note that in some cases, the laser light 150 entering the sealing member 123 after being reflected by the wiring layer 112 is reflected by the metal layer 122 to enter the sealing member 123 again.

In general, the laser light reflected by the wiring layer enters the sealing member again in the region overlapping with the wiring layer, which causes the region to have higher energy of the emitted laser light than the other region (i.e., the region which does not overlap with the wiring layer). When the sealing member is irradiated with excess energy of laser light to have a temperature higher than a desired temperature, the sealing member has lower adhesion, which means that irradiation with excess energy causes a reduction in the degree of the sealed property between the substrates.

However, in the method for manufacturing the sealed body 100 of one embodiment of the present invention, the energy emitted to the sealing member 123 in the region 302 is reduced by the metal layer 122, whereby energy which is necessary and sufficient for melting glass frits can be supplied to both the region 302 and the region 300 without adjusting the output of the laser light for each region.

Note that the beam diameter of the emitted laser light 150 is preferably larger than the space (L1) between the adjacent wiring layers 112. In such a case, a region which overlaps with the metal layer 122 and does not overlap with the wiring layer 112 is irradiated with laser light reflected by the adjacent wiring layer 112; thus, energy which is necessary for melting the glass frits contained in the sealing member 123 in the region can be supplied.

Further, a metal has higher heat conductivity than an insulator and accordingly can conduct heat generated by absorption of laser light more efficiently than the insulator. Thus, glass fits contained in the sealing member 123 in the region 302 interposed between the wiring layer 112 and the metal layer 122 can be welded with lower irradiation energy of laser light than in the case of welding glass frits contained in the sealing member 123 in a region interposed between the element formation substrate 110 and the counter substrate 120 which are insulators. Thus, glass fits can be efficiently welded even when a material with high reflectance is used for the metal layer 122.

The structure described in this embodiment enables the substrate surface to be irradiated with substantially uniform energy of the laser light 150 without controlling the output of the laser light 150 for each region. Thus, an improvement in yield as well as simplification of the manufacturing process of the sealed body 100 can be achieved.

The energy of the laser light 150 entering the wiring layer 112 is reduced by the metal layer 122; thus, deformation or disconnection of the wiring layer 112, which might be caused by irradiation with high-energy laser light, can be prevented.

The metal layer 122 is positioned on the inner side of the counter substrate 120 and thus can prevent peeling of the metal layer due to laser light irradiation. The degree of adhesion between the metal layer 122 and the sealing member 123 can be high owing to two heat treatment steps of prebaking and laser light irradiation.

The glass fits contained in the sealing member 123 are melted by the irradiation of the sealing member 123 with the laser light 150, so that the sealing layer 124 is formed (see FIG. 2E), whereby the element formation substrate 110 and the counter substrate 120 are welded together. Thus, the sealed body 100 having high airtightness (sealed property) can be obtained.

The sealed body 100 of this embodiment can be formed as described above.

In the sealed body 100 described in this embodiment, the metal layer 122 which is in contact with the counter substrate 120 is provided in the region overlapping with the wiring layer 112, so that irradiation of the sealing member 123 in the region with excess energy and a reduction in the adhesion of the sealing member 123 can be prevented. In addition, the metal layer 122 is selectively formed in the region overlapping with the wiring layer 112, whereby most region of the closed-loop sealing member 123 can be in contact with the counter substrate 120 and the element formation substrate 110. In particular, favorable welding can be performed at the corner of the closed loop which requires high bond strength, leading to a semiconductor device with a high sealed property.

In the sealed body 100 described in this embodiment, the adhesion of the sealing layer is high; thus, the width of the sealing layer does not need to be increased for desired adhesion, resulting in a narrower frame. In addition, the mechanical strength can be increased, so that a reduction in yield of manufacture of the sealed body can be suppressed. Moreover, deterioration of the semiconductor element inside the sealing layer can be suppressed, so that the reliability can be increased.

This embodiment can be combined with any of the other embodiments disclosed in this specification as appropriate.

Embodiment 2

In this embodiment, a semiconductor device including a display element (also referred to as a display device) is described with reference to FIGS. 3A to 3C as an example of the semiconductor device including the semiconductor element inside the sealed body, which is described in Embodiment 1.

Figure 3A:
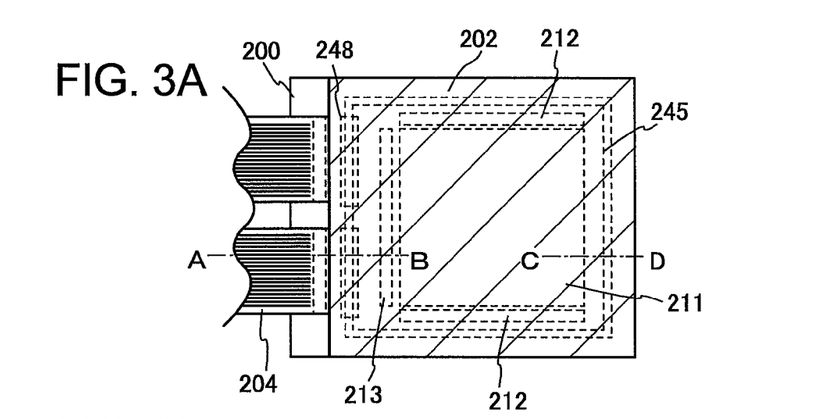
FIGS. 3A to 3C are a plan view and cross-sectional views illustrating an example of a semiconductor device.

In FIG. 3A, a sealing layer 245 is provided so as to surround a pixel portion 211, a gate driver circuit 213, and a source driver circuit 212 which are provided over an element formation substrate 200, and a counter substrate 202 is provided for sealing. In addition, a metal layer 248 is provided so as to overlap with part of the sealing layer 245. A variety of signals and potentials are supplied to the pixel portion 211 through the gate driver circuit 213 from a flexible printed circuit (FPC) 204.

Note that the display device includes a panel in which the display element is sealed, and a module in which an IC including a controller or the like is mounted on the panel. In other words, the display device in this specification means an image display device or a light source (including a lighting device). Furthermore, the display device also includes the following modules in its category: a module to which a connector such as an FPC or a TCP is attached; a module having a TCP at the end of which a printed wiring board is provided; and a module in which an integrated circuit (IC) is directly mounted on a display element by a COG method.

As the display element provided in the display device, a liquid crystal element (also referred to as liquid crystal display element) or a light-emitting element (also referred to as light-emitting display element) can be used. The light-emitting element includes an element whose luminance is controlled by current or voltage in its category, and specifically includes an inorganic electroluminescent (EL) element, an organic EL element, and the like. Furthermore, a display medium whose contrast is changed by an electric effect, such as an electronic ink display (electronic paper), can be used.

Embodiments of the semiconductor device are described with reference to FIGS. 3B and 3C. FIGS. 3B and 3C are each a schematic cross-sectional view of a region including the FPC 204 and the gate driver circuit 213 along the section line A-B and a region including the pixel portion 211 along the section line C-D, in the display device illustrated in FIG. 3A.

Figure 3B:
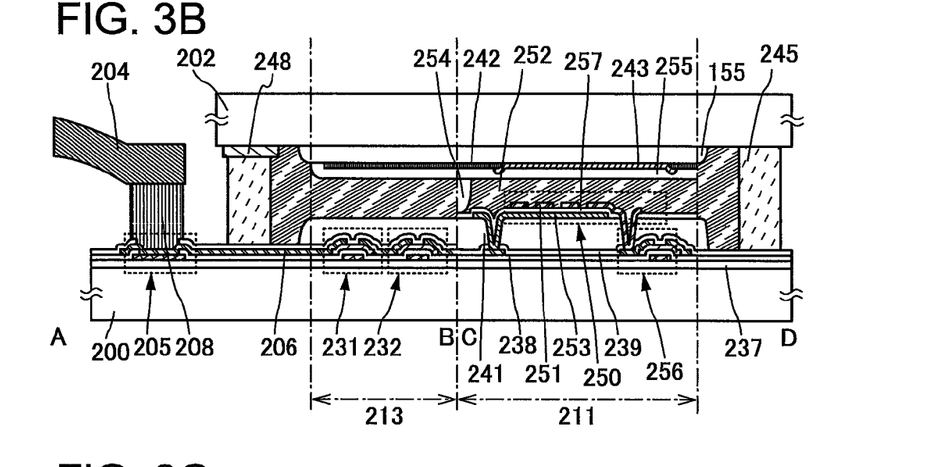

Note that FIG. 3B illustrates an example of a liquid crystal display device using a liquid crystal element as a display element. A liquid crystal display device can employ a vertical electric field mode or a horizontal electric field mode. FIG. 3B illustrates an example to which a fringe field switching (FFS) mode is applied as an example of the horizontal electric field mode. FIG. 3C illustrates an example of an EL display device including a light-emitting element as a display element.

In the display device described in this embodiment, the transistor provided in the pixel portion 211 is electrically connected to the display element. Note that the display element that can be applied to the display device described in this embodiment is not particularly limited as long as it can perform display, and a variety of display elements can be used.

The element formation substrate 200 and the counter substrate 202 are bonded to each other with the sealing layer 245 at the edge portions of the element formation substrate 200 and the counter substrate 202. At least the pixel portion 211 is provided in a region surrounded by the element formation substrate 200, the counter substrate 202, and the sealing layer 245.

Figure 3C:
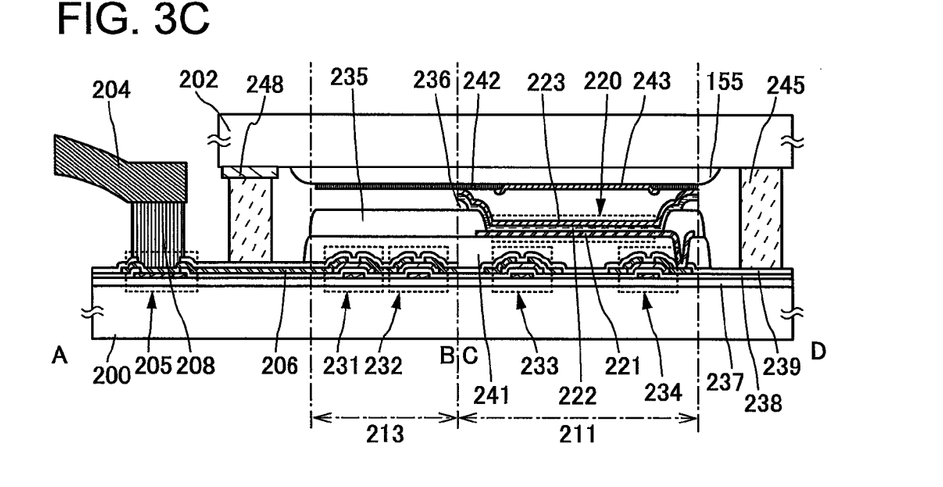

In each of FIGS. 3A to 3C, the gate driver circuit 213 includes a circuit in which n-channel transistors, transistors 231 and 232, are used in combination, as an example. Note that the gate driver circuit 213 is not limited to this structure and may include various CMOS circuits in which an n-channel transistor and a p-channel transistor are used in combination or a circuit in which p-channel transistors are used in combination. Note that the same applies to the source driver circuit 212. Although a driver-integrated structure in which the gate driver circuit 213 and the source driver circuit 212 are formed over an insulating surface provided with the pixel portion 211 is described in this structural example, the gate driver circuit 213 or the source driver circuit 212, or both may be formed over a surface different from the insulating surface provided with the pixel portion 211. For example, a driver circuit IC may be mounted by a COG method, or a flexible substrate (FPC) mounted with a driver circuit IC by a COF method may be mounted.

Note that there is no particular limitation on the structures of the transistors included in the pixel portion 211, the source driver circuit 212, and the gate driver circuit 213. For example, a forward staggered transistor or an inverted staggered transistor may be used. Further, a top-gate transistor or a bottom-gate transistor may be used. As a semiconductor material used for the transistors, for example, a semiconductor material such as silicon or germanium or an oxide semiconductor containing at least one of indium, gallium, and zinc may be used.

Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

Typical examples of the oxide semiconductor containing at least one of indium, gallium, and zinc include an In—Ga—Zn-based metal oxide. An oxide semiconductor having a wider band gap and a lower carrier density than silicon is preferably used because off-state leakage current can be reduced.

FIGS. 3B and 3C each illustrate a cross-sectional structure of one pixel as an example of the pixel portion 211. The pixel portion 211 in FIG. 3B is provided with a liquid crystal element 250 having an FFS mode. In the liquid crystal element 250, the orientation of a liquid crystal is controlled by an electric field generated in an oblique direction to the substrate surface.

The one pixel includes at least one switching transistor 256 and a storage capacitor which is not illustrated. In addition, a first electrode 251 that is electrically connected to a source electrode or a drain electrode of the transistor 256 and has a comb shape is provided over the insulating layer 257. Furthermore, a second electrode 253 is provided over the insulating layer 241 with the insulating layer 257 provided therebetween so as to be insulated from the first electrode 251.

For the second electrode 253, or both of the first electrode 251 and the second electrode 253, a light-transmitting conductive material is used. It is preferable to use a light-transmitting conductive material for both of these electrodes because the aperture ratio of the pixel can be increased. As the light-transmitting conductive material, a conductive oxide such as indium oxide, indium tin oxide, indium zinc oxide, zinc oxide, or zinc oxide to which gallium is added, or graphene can be used.

Further, a color filter 243 and a black matrix 242 are provided on the counter substrate 202 in at least a region overlapping with the pixel portion 211.

The color filter 243 is provided in order to adjust the color of light transmitted through a pixel to increase the color purity. For example, in a full-color display device using a white back light, a plurality of pixels provided with color filters of different colors are used. In that case, the color filters may be those of three colors of R (red), G (green), and B (blue) or four colors (yellow (Y) in addition to these three colors). Further, a white (W) pixel may be added to R, G, and B pixels (and a Y pixel). That is, color filters of four colors (or five colors) may be used.

The black matrix 242 is provided between the adjacent color filters 243. The black matrix 242 blocks light emitted from an adjacent pixel, thereby preventing color mixture between the adjacent pixels. In one configuration, the black matrix 242 may be provided only between adjacent pixels of different emission colors and not between pixels of the same emission color. When the color filter 243 is provided so that its end portion overlaps with the black matrix 242, light leakage can be reduced. The black matrix 242 can be formed using a material that blocks light transmitted through the pixel, for example, a metal material or a resin material including a pigment. Note that the black matrix 242 is preferably provided in a region overlapping with the gate driver circuit 213 or the like besides the pixel portion 211 as illustrated in FIGS. 3B and 3C, in which case undesired leakage of guided light or the like can be prevented.

An overcoat 255 is provided so as to cover the color filter 243 and the black matrix 242. The overcoat 255 can suppress diffusion of impurities such as a pigment, which are included in the color filter 243 and the black matrix 242, into a liquid crystal 252. For the overcoat, a light-transmitting material is used, and an inorganic insulating material or an organic insulating material can be used.

The color filter 243, the black matrix 242, and the overcoat 255 which are formed over the counter substrate 202 may be formed after the metal layer 248 and the sealing member are formed over the counter substrate 202 or before the metal layer 248 and/or the sealing member are/is formed over the counter substrate 202. Note that in the case where the color filter and the like are formed before the formation of the sealing member, a material having heat resistance to heating temperature of prebaking of the sealing member is selected.

A spacer 254 is provided in a region where the overcoat 255 overlaps with the black matrix 242. The spacer 254 is preferably formed using a resin material, in which case it can be formed thick. For example, the spacer 254 can be formed using a positive or negative photosensitive resin. When a light-blocking material is used for the spacer 254, the spacer 254 blocks light emitted from an adjacent pixel, thereby preventing color mixture between the adjacent pixels.

Although the spacer 254 is provided on the counter substrate 202 side in this structural example, the spacer 254 may be provided on the element formation substrate 200 side. Further, a structure may be employed in which spherical silicon oxide particles are used as the spacer 254 and the particles are scattered in a region where the liquid crystal 252 is provided.

The liquid crystal 252 is sealed at least in a region where the first electrode 251 and the second electrode 253 are provided. Here, the first electrode 251, the second electrode 253, and the liquid crystal 252 form the liquid crystal element 250.

An image can be displayed in the following way: an electric field is generated in the oblique direction by application of voltage between the first electrode 251 and the second electrode 253, orientation of the liquid crystal 252 is controlled by the electric field, and polarization of light from a backlight provided outside the display device is controlled in each pixel.

An alignment film that controls orientation of the liquid crystal 252 may be provided on a surface in contact with the liquid crystal 252. A light-transmitting material is used for the alignment film. Although not illustrated here, a polarizing plate is provided outside the element formation substrate 200 with respect to the liquid crystal element 250. Moreover, a light guide plate may be used so that light from the backlight enters through a side surface of the display device.

In this configuration example, a color filter is provided in a region overlapping with the liquid crystal element 250; thus, a full-color image can be displayed using a backlight that emits white light. With the use of a plurality of light-emitting diodes (LEDs) which emit light of different colors as a backlight, a time-division display method (a field-sequential driving method) can be employed. In the case of employing a time-division display method, the aperture ratio of each pixel or the number of pixels per unit area can be increased because neither color filters nor subpixels from which light of red (R), green (G), or blue (B), for example, is obtained are needed.

As the liquid crystal 252, a thermotropic liquid crystal, a low molecular weight liquid crystal, a polymer liquid crystal, a ferroelectric liquid crystal, an anti-ferroelectric liquid crystal, or the like can be used. Moreover, a liquid crystal exhibiting a blue phase is preferably used because an alignment film is not necessary and the viewing angle is wide.

Note that the liquid crystal element 250 to which the FFS mode is applied is described in this structural example; however, the structure of the liquid crystal element is not limited thereto.

The element formation substrate 200 is provided with an insulating layer 237 in contact with an upper surface of the element formation substrate 200, an insulating layer 238 functioning as a gate insulating layer of transistors, and insulating layers 239 and 241 covering the transistors.

The insulating layer 237 is provided in order to prevent diffusion of impurities included in the element formation substrate 200. The insulating layers 238 and 239, which are in contact with semiconductor layers of the transistors, are preferably formed using a material which prevents diffusion of impurities that promote degradation of the transistors. For these insulating layers, for example, an oxide, a nitride, or an oxynitride of a semiconductor such as silicon or a metal such as aluminum can be used. Alternatively, a stack of such inorganic insulating materials or a stack of such an inorganic insulating material and an organic insulating material may be used. Note that the insulating layers 237 and 239 are not necessarily provided when not needed.

The insulating layer 241 functions as a planarization layer which covers steps due to the transistors, a wiring layer, or the like provided therebelow. For the insulating layer 241, it is preferable to use an organic resin material such as polyimide or acrylic. An inorganic insulating material may be used as long as high planarity can be obtained. Note that the insulating layer 241 is not necessarily provided.

Although not illustrated, a polarizing plate, a backlight, or the like may be provided as appropriate.

A wiring layer 206 provided over the element formation substrate 200 is electrically connected to the gate driver circuit 213 or the source driver circuit 212 and extends outward from the region sealed by the sealing layer 245. Part of an end portion of the wiring layer 206 forms part of the external connection electrode 205. In this structural example, the external connection electrode 205 is formed by a stack of a conductive film used for the source electrode and the drain electrode of the transistor and a conductive film used for the gate electrode of the transistor. The external connection electrode 205 is preferably formed by a stack of a plurality of conductive films as described above because mechanical strength against a pressure bonding step performed on the FPC 204 or the like can be increased.

The metal layer 248 is provided in a region which overlaps with the wiring layer 206 with the sealing layer 245 therebetween. This structure can prevent the sealing member in the region to be irradiated with excess energy in a laser light irradiation step for welding the element formation substrate 200 and the counter substrate 202 together, leading to an improvement in the adhesion of the sealing layer 245. Thus, the reliability of the semiconductor device can be improved.

A connection layer 208 is provided in contact with the external connection electrode 205. The FPC 204 is electrically connected to the external connection electrode 205 through the connection layer 208. The FPC 204 is electrically connected to the external connection electrode 205 through the connection layer 208. For the connection layer 208, an anisotropic conductive film (ACF), anisotropic conductive paste (ACP), or the like can be used.

The end portions of the wiring layer 206 and the external connection electrode 205 are preferably covered with an insulating layer so that surfaces thereof are not exposed, in which case oxidation of the surfaces and defects such as an unintended short circuit can be suppressed.

A cross-sectional structural example of a display device in which an organic EL element is used in the pixel portion 211 is described with reference to FIG. 3C. Note that description of the same portions as those in FIG. 3B is skipped or simplified in some cases.

The display device illustrated in FIG. 3C is different from the display device illustrated in FIG. 3B mainly in the structure of the pixel portion 211.

One pixel in the pixel portion 211 includes a switching transistor 233, a current control transistor 234, and a first electrode 221 that is electrically connected to an electrode (a source electrode or a drain electrode) of the transistor 234. An insulating layer 235 is provided so as to cover an end portion of the first electrode 221, and a spacer 236 is provided over the insulating layer 235 in a region overlapping with the black matrix 242. When a plurality of spacers 236 are provided in the pixel portion 211, the element formation substrate 200 and the counter substrate 202 can be prevented from getting unnecessarily close to each other, and the display device can have high reliability.

A light-emitting element 220 includes a first electrode 221, a second electrode 223, and an EL layer 222 sandwiched between the first electrode 221 and the second electrode 223. The light-emitting element 220 is described below.

In the light-emitting element 220, a light-transmitting material that transmits light emitted from the EL layer 222 is used for an electrode provided on the light exit side.

As the light-transmitting material, other than the above-described conductive oxide and graphene, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased.

The electrode provided on the light exit side is formed by a vacuum evaporation method, a sputtering method, or the like. A discharging method such as an ink-jet method, a printing method such as a screen printing method, or a plating method may be used.

Note that when the above conductive oxide film having a light-transmitting property is formed by a sputtering method, the use of a deposition atmosphere containing argon and oxygen allows the light-transmitting property to be increased.

Further, in the case where a film of the conductive oxide is formed over the EL layer 222, it is preferable to stack a first conductive oxide film formed under an atmosphere containing argon with reduced oxygen concentration and a second conductive oxide film formed under an atmosphere containing argon and oxygen, in which case damage to the EL layer 222 due to film formation can be reduced. Here, the purity of an argon gas used for formation of the first conductive oxide film is preferably high, and for example, it is preferable to use the argon gas whose dew point is lower than or equal to −70° C., more preferably lower than or equal to −100° C.

For an electrode provided on a side opposite to the light exit side, a reflective material which reflects the light emission is used.

As a light reflective material, a metal material such as aluminum, gold, platinum, silver, nickel, tungsten, chromium, molybdenum, iron, cobalt, copper, or palladium or an alloy material containing any of these metal materials can be used. Alternatively, lanthanum, neodymium, germanium, or the like may be added to any of the above the metal materials or the alloy materials. Examples of alloy materials include alloys containing aluminum (aluminum alloys) such as an alloy of aluminum and titanium, an alloy of aluminum and nickel, and an alloy of aluminum and neodymium, alloys containing silver such as an alloy of silver and copper, an alloy of silver, palladium, and copper, and an alloy of silver and magnesium. An alloy of silver and copper is preferable because of its high heat resistance. Further, when a metal film or a metal oxide film is stacked to be in contact with a film containing aluminum, oxidation of the film containing aluminum can be suppressed. Examples of the metal material or the metal oxide material in contact with the film containing aluminum include titanium and titanium oxide. Alternatively, the conductive layer may be a stack of a film containing any of the above light-transmitting materials and a film containing any of the above metal materials. For example, the conductive layer can be a stack of silver and indium tin oxide or a stack of an alloy of silver and magnesium and indium tin oxide.

The electrode provided on the light exit side is formed by a vacuum evaporation method, a sputtering method, or the like. A discharging method such as an ink-jet method, a printing method such as a screen printing method, or a plating method may be used.

The EL layer 222 includes at least a layer containing a light-emitting organic compound (hereinafter also referred to as a light-emitting layer), and may be either a single layer or a stack of plural layers. One example of the structure in which a plurality of layers is stacked is a structure in which a hole-injection layer, a hole-transport layer, a light-emitting layer, an electron-transport layer, and an electron-injection layer are stacked in this order from an anode side. Note that not all of these layers except the light-emitting layer are necessarily provided in the EL layer 222. Further, each of these layers may be provided in duplicate or more. Specifically, in the EL layer 222, a plurality of light-emitting layers may be stacked. Furthermore, another component such as a charge-generation region may be added as appropriate. Alternatively, a plurality of light-emitting layers exhibiting different colors may be stacked each other. For example, a white emission can be obtained by stacking two or more layers emitting light of complementary colors.

The EL layer 222 can be formed by a vacuum evaporation method, a discharging method such as an ink-jet method or a dispensing method, a coating method such as a spin-coating method, a printing method, or the like.

In this embodiment, a reflective material is used for the first electrode 221, and a light-transmitting material is used for the second electrode 223. Thus, the light-emitting element 220 is a top-emission light-emitting element, and emits light to the counter substrate 202 side.

Note that in FIG. 3C, the insulating layer 235 and the insulating layer 241 each of which is formed of an organic insulating material are processed into island shapes on the inner side of the sealing layer 245 and are not in contact with the sealing layer 245. The layers containing an organic material are provided so as not to be in contact with the sealing layer 245 or so as not to extend outward beyond the sealing layer 245, whereby diffusion of impurities such as moisture into the light-emitting element 220 or the transistors through the layers containing an organic material can be suppressed. In the case of using an oxide semiconductor for a transistor, mixture of moisture can be effectively blocked.

The sealing layer 245 described in this embodiment is a glass body formed by melting and solidifying glass frits. Such a material can effectively suppress permeation of moisture and a gas and can therefore suppress the deterioration of the light-emitting element 220. Thus, the display device can have very high reliability.

According to one embodiment of the present invention, the airtightness of the semiconductor device in which sealing is performed with the use of glass frits as a material can be improved. In addition, the yield of manufacture of the semiconductor device can be improved. Thus, a highly reliable semiconductor device can be provided at low cost.

This embodiment can be combined with any of the other embodiments disclosed in this specification as appropriate.

Embodiment 3

In this embodiment, examples of an electronic appliance and a lighting device to which the semiconductor device described in any of the above embodiments are described with reference to FIGS. 4A to 4E and FIGS. 5A to 5C.

Examples of the electronic appliance of this embodiment include a television device (also called TV or a television receiver), a monitor for a computer or the like, a camera such as a digital camera or a digital video camera, a digital photo frame, a mobile phone set (also called a mobile phone or a portable telephone device), a portable game machine, a portable information terminal, an audio playback device, and a large game machine such as a pachinko machine. Specific examples of the electronic appliances are illustrated in FIGS. 4A to 4E.

Figure 4A:
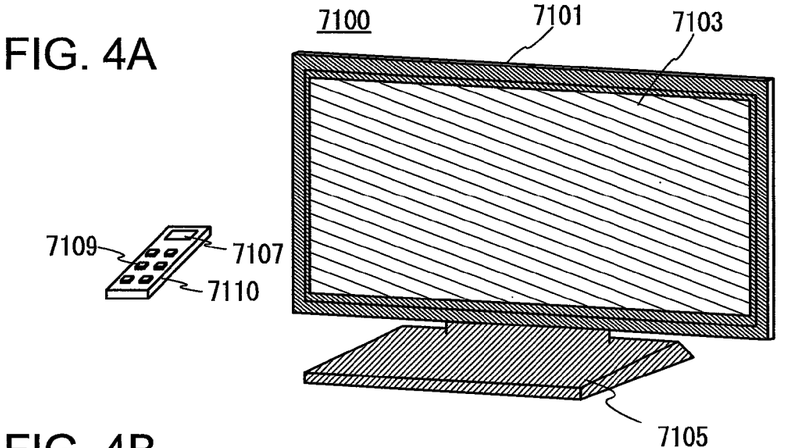
FIGS. 4A to 4E illustrate electronic appliances.

FIG. 4A illustrates an example of a television device. In the television device 7100, a display portion 7103 is incorporated in a housing 7101. Images can be displayed on the display portion 7103, and the semiconductor device described in any of the above embodiments can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 4B:
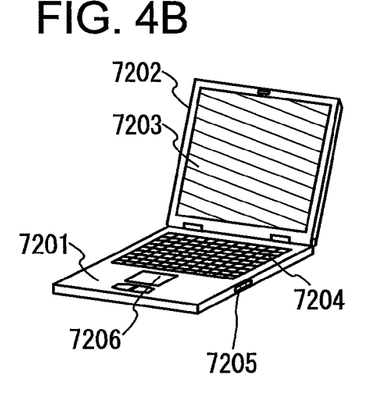

FIG. 4B illustrates a computer, which includes a main body 7201, a housing 7202, a display portion 7203, a keyboard 7204, an external connection port 7205, a pointing device 7206, and the like. The computer is manufactured using the semiconductor device described in any of the above embodiments for the display portion 7203.

Figure 4C:
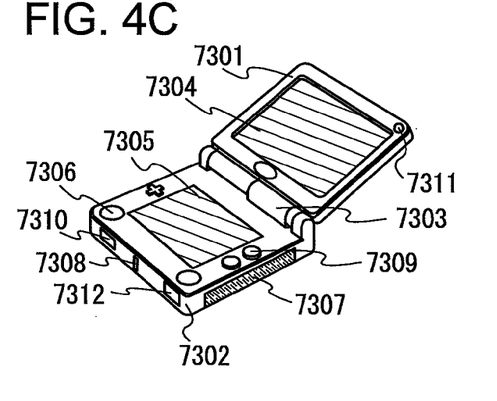

FIG. 4C illustrates a portable game machine, which includes two housings, i.e., a housing 7301 and a housing 7302, connected to each other via a joint portion 7303 so that the portable game machine can be opened and closed. A display portion 7304 is incorporated in the housing 7301 and a display portion 7305 is incorporated in the housing 7302. In addition, the portable game machine illustrated in FIG. 4C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), and a microphone 7312), and the like. It is needless to say that the structure of the portable game machine is not limited to the above as long as the semiconductor device described in any of the above embodiments is used for at least either the display portion 7304 or the display portion 7305, or both, and may include other accessories as appropriate.

The portable game machine illustrated in FIG. 4C has a function of reading out a program or data stored in a storage medium to display it on the display portion, and a function of sharing information with another portable game machine by wireless communication. Note that the portable game machine illustrated in FIG. 4C can have a variety of functions without limitation to those described above.

Figure 4D:
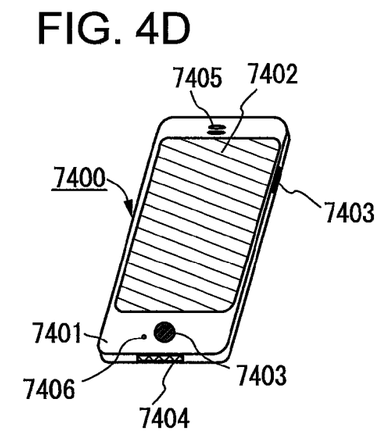

FIG. 4D illustrates an example of a mobile phone. The mobile phone 7400 is provided with a display portion 7402 incorporated in a housing 7401, operation buttons 7403, an external connection port 7404, a speaker 7405, a microphone 7406, and the like. The mobile phone 7400 is manufactured using the semiconductor device described in any of the above embodiments for the display portion 7402.

When the display portion 7402 of the mobile phone 7400 illustrated in FIG. 4D is touched with a finger or the like, data can be input to the mobile phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits near-infrared light in the display portion, an image of a forger vein, a palm vein, or the like can be taken.

Figure 4E:
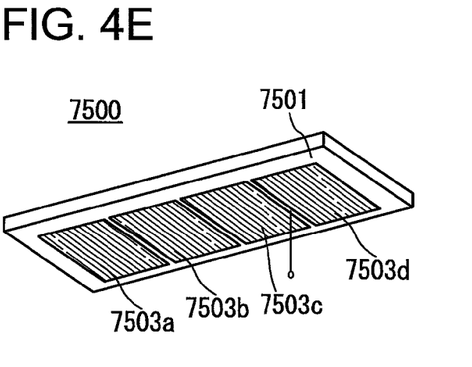

FIG. 4E illustrates an example of a lighting device. In a lighting device 7500, semiconductor devices 7503$a$, 7503$b$, 7503$c$, and 7503$d$, each of which is the semiconductor device described in any of the above embodiments, are incorporated in a housing 7501 as light sources. The lighting device 7500 can be attached to a ceiling, a wall, or the like.

Further, the light-emitting device includes a light-emitting panel which emits light having high brightness and a pale color and causing less eyestrain even in the case of long-time use, light of a bright red color, and light of a bright color different from the other colors. By adjusting conditions under which the light-emitting element is driven for each emission color, a lighting device whose hue can be adjusted by a user can be achieved.

Figure 5A:
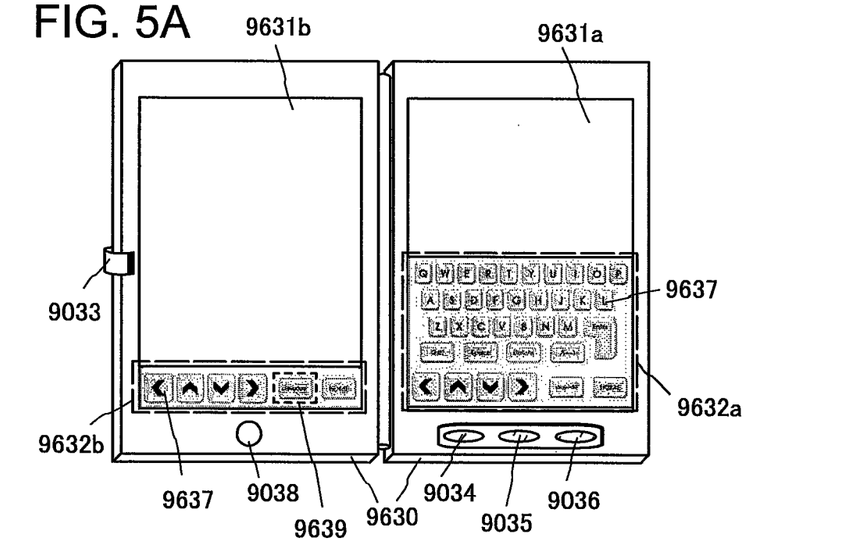
FIGS. 5A to 5C illustrate an electronic appliance.
Figure 5B:
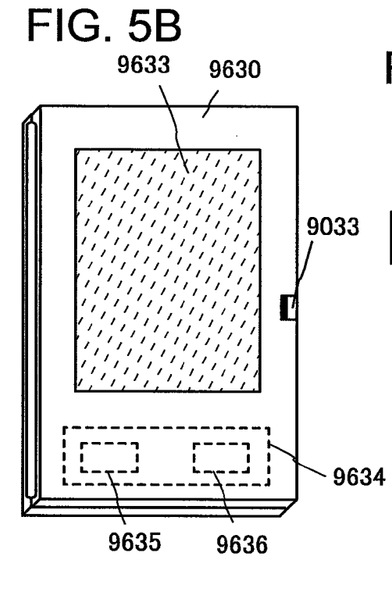

FIGS. 5A and 5B illustrate a foldable tablet terminal. In FIG. 5A, the tablet terminal is open and includes a housing 9630, a display portion 9631a, a display portion 9631b, a display mode switch 9034, a power switch 9035, a power saver switch 9036, a fastener 9033, and an operation switch 9038. Note that in the tablet terminal, one or both of the display portions 9631a and 9631b is/are formed using the semiconductor device described in any of the above embodiments.

A touch panel area 9632a can be provided in a part of the display portion 9631a, in which area, data can be input by touching displayed operation keys 9637. Note that FIG. 5A illustrates, as an example, that half of the area of the display portion 9631a has only a display function and the other half of the area has a touch panel function. However, the structure of the display portion 9631a is not limited to this. The whole display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel area 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel areas 9632a and 9632b.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Note that FIG. 5A shows an example in which the display portion 9631a and the display portion 9631b have the same display area; however, without limitation thereon, one of the display portions may be different from the other display portion in size and display quality. For example, one of them may be a display panel that can display higher-definition images than the other.

The tablet terminal is closed in FIG. 5B. The tablet terminal includes the housing 9630, a solar cell 9633, a charge and discharge control circuit 9634, a battery 9635, and a DCDC converter 9636. In FIG. 5B, a structure including the battery 9635 and the DCDC converter 9636 is illustrated as an example of the charge and discharge control circuit 9634.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

In addition, the tablet terminal illustrated in FIGS. 5A and 5B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is attached to the surface of the tablet terminal, supplies electric power to a touch panel, a display portion, an image signal processor, and the like. Note that a structure in which the solar cell 9633 is provided on one or two surfaces of the housing 9630 is preferable to charge the battery 9635 efficiently. When a lithium ion battery is used as the battery 9635, there is an advantage of downsizing or the like.

The structure and the operation of the charge and discharge control circuit 9634 illustrated in FIG. 5B are described with reference to a block diagram of FIG. 5C. The solar cell 9633, the battery 9635, the DCDC converter 9636, a converter 9638, switches SW1 to SW3, and the display portion 9631 are illustrated in FIG. 5C, and the battery 9635, the DCDC converter 9636, the converter 9638, and the switches SW1 to SW3 correspond to the charge and discharge control circuit 9634 illustrated in FIG. 5B.

First, an example of operation in the case where power is generated by the solar cell 9633 using external light is described. The voltage of power generated by the solar cell is raised or lowered by the DCDC converter 9636 so that the power has voltage for charging the battery 9635. When the display portion 9631 is operated with the power from the solar cell 9633, the switch SW1 is turned on and the voltage of the power is raised or lowered by the converter 9638 to voltage needed for operating the display portion 9631. In addition, when display on the display portion 9631 is not performed, the switch SW1 is turned off and a switch SW2 is turned on so that charge of the battery 9635 may be performed.

Here, the solar cell 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 5C:
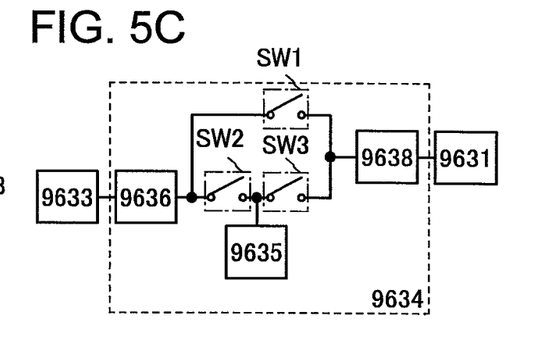

It is needless to say that one embodiment of the present invention is not limited to the electronic appliance illustrated in FIGS. 5A to 5C as long as the display device described in any of the above embodiments is included.

The electronic appliances and the lighting device described in this embodiment can be manufactured using the semiconductor device described in any of the above embodiments. Therefore, the electronic appliances and the lighting device can have high reliability.

This embodiment can be combined with any of the other embodiments disclosed in this specification as appropriate.

This application is based on Japanese Patent Application serial no. 2012-242828 filed with Japan Patent Office on Nov. 2, 2012, the entire contents of which are hereby incorporated by reference.

What is claimed is:

1. A sealed body comprising:
   a first substrate provided with a wiring layer and a transistor for driving a pixel portion;

a second substrate provided with a metal layer, wherein the metal layer does not include an opening portion, and wherein the metal layer and the transistor do not overlap each other; and a sealing layer bonding the first substrate and the second substrate, wherein the wiring layer and the metal layer are positioned between the first substrate and the second substrate, wherein the metal layer, the wiring layer and the sealing layer overlap each other, wherein the metal layer is configured to transmit a laser light and the wiring layer is configured to reflect the laser light which is transmitted through the metal layer itself, and wherein the metal layer is in contact with the sealing layer.

2. The sealed body according to claim 1,
wherein the wiring layer is positioned between the first substrate and the sealing layer, and
wherein the metal layer is positioned between the sealing layer and the second substrate.

3. The sealed body according to claim 1,
wherein the wiring layer extends outward from an inner side of the sealing layer.

4. The sealed body according to claim 1,
wherein a light transmittance of the metal layer is lower than a light transmittance of the second substrate, and
wherein a light reflectance of the metal layer is higher than a light reflectance of the second substrate.

5. The sealed body according to claim 1,
wherein the sealing layer comprises glass.

6. The sealed body according to claim 1,
wherein the sealing layer is in the form of a closed loop.

7. The sealed body according to claim 1, further comprising a liquid crystal element between the first substrate and the second substrate.

8. The sealed body according to claim 1, further comprising a light-emitting element between the first substrate and the second substrate,
wherein the light-emitting element and the metal layer do not overlap each other.

9. The sealed body according to claim 1, wherein a width of the metal layer in a short-side direction is larger than a width of the sealing layer.

10. A method for manufacturing a sealed body, comprising the steps of:
forming a wiring layer and a pixel portion including a transistor over a first substrate;
forming a metal layer over a second substrate, wherein the metal layer does not include an opening portion, and wherein the metal layer and the pixel portion do not overlap each other;
forming a sealing member over the second substrate, the sealing member comprising glass;
overlapping the first substrate and the second substrate so that the wiring layer and the metal layer are positioned between the first substrate and the second substrate, and the metal layer and the wiring layer overlap each other; and
heating the sealing member so that the first substrate is bonded to the second substrate by a sealing layer, wherein the metal layer is configured to transmit a laser light and the wiring layer is configured to reflect the laser light which is transmitted through the metal layer itself.

11. The method for manufacturing a sealed body, according to claim 10,
wherein a laser light irradiation treatment is performed in the step of heating the sealing member.

12. A sealed body comprising:
a first substrate provided with a wiring layer and a pixel portion including a transistor;
a second substrate provided with a metal layer, wherein the metal layer does not include an opening portion, and wherein the metal layer and the pixel portion do not overlap each other; and
a sealing layer bonding the first substrate and the second substrate, wherein the wiring layer and the metal layer are positioned between the first substrate and the second substrate, wherein the metal layer, the wiring layer and the sealing layer overlap each other, wherein the metal layer is configured to transmit a laser light and the wiring layer is configured to reflect the laser light which is transmitted through the metal layer itself, and wherein the metal layer is in contact with the sealing layer.

13. The sealed body according to claim 12,
wherein the wiring layer is positioned between the first substrate and the sealing layer, and
wherein the metal layer is positioned between the sealing layer and the second substrate.

14. The sealed body according to claim 12,
wherein the wiring layer extends outward from an inner side of the sealing layer.

15. The sealed body according to claim 12,
wherein a light transmittance of the metal layer is lower than a light transmittance of the second substrate, and
wherein a light reflectance of the metal layer is higher than a light reflectance of the second substrate.

16. The sealed body according to claim 12,
wherein the sealing layer comprises glass.

17. The sealed body according to claim 12,
wherein the sealing layer is in the form of a closed loop.

18. The sealed body according to claim 12, further comprising a liquid crystal element between the first substrate and the second substrate.

19. The sealed body according to claim 12, further comprising a light-emitting element between the first substrate and the second substrate,
wherein the light-emitting element and the metal layer do not overlap each other.

20. The sealed body according to claim 12,
wherein a width of the metal layer in a short-side direction is larger than a width of the sealing layer.

* * * * *